(12) United States Patent
Sakaguchi

(10) Patent No.: US 10,088,604 B2
(45) Date of Patent: Oct. 2, 2018

(54) TRANSPARENT SUBSTRATE FOR OPTICAL ELEMENTS, POLARIZER PLATE FOR LIQUID CRYSTAL DISPLAY DEVICE USING SAID SUBSTRATE, AND ORGANIC ELECTROLUMINESCENCE ELEMENT

(71) Applicant: NEC Lighting, Ltd., Tokyo (JP)

(72) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 53 days.

(21) Appl. No.: 14/389,548

(22) PCT Filed: Mar. 25, 2013

(86) PCT No.: PCT/JP2013/058506
§ 371 (c)(1),
(2) Date: Sep. 30, 2014

(87) PCT Pub. No.: WO2013/146642
PCT Pub. Date: Oct. 3, 2013

(65) Prior Publication Data
US 2015/0072124 A1   Mar. 12, 2015

(30) Foreign Application Priority Data
Mar. 30, 2012 (JP) ................... 2012-079906

(51) Int. Cl.
*G02B 1/10* (2015.01)
*G02B 5/30* (2006.01)
(Continued)

(52) U.S. Cl.
CPC ............... *G02B 1/14* (2015.01); *G02B 1/105* (2013.01); *G02B 5/3033* (2013.01);
(Continued)

(58) Field of Classification Search
CPC ......... H01L 51/0096; Y10T 428/31765; Y10T 428/31938; Y10T 428/31935;
(Continued)

(56) References Cited

U.S. PATENT DOCUMENTS 4,687,968 A * 8/1987 Frayer ..................... B32B 27/08
313/509
7,781,034 B2 * 8/2010 Yializis ..................... B32B 7/02
428/34.7
(Continued)

FOREIGN PATENT DOCUMENTS

JP      H10-329256 A    12/1998
JP      2997741         11/1999
(Continued)

OTHER PUBLICATIONS

Fowzy, M. "PFPE, A Unique Lubricant for a Unique Application". Defense Technical Information Center, (1998); pp. 1-11.*
(Continued)

Primary Examiner — Prashant J Khatri
(74) Attorney, Agent, or Firm — Young & Thompson

(57) ABSTRACT

A transparent substrate for optical elements which is capable of suppressing cracking is provided, and a transparent substrate for optical elements which is capable of extending the life of optical elements such as organic EL elements used in organic EL illumination devices or polarizer plates used in liquid crystal display devices is provided. This transparent substrate for optical elements is characterized by having an inorganic layer and a hydrophilic layer laminated sequentially on a transparent resin film. For this reason, this transparent substrate for optical elements can have excellent gas barrier properties, inhibits degeneration of optical elements due to water vapor, suppresses cracking, is transparent and flexible, is easy to handle, can be efficiently and eco-
(Continued)

nomically manufactured, and has excellent design properties.

16 Claims, 3 Drawing Sheets

(51) Int. Cl.
    *H01L 51/52*         (2006.01)
    *G02F 1/1335*      (2006.01)
    *G02B 1/14*         (2015.01)
    *H01L 51/00*         (2006.01)

(52) U.S. Cl.
    CPC .... *G02F 1/133528* (2013.01); *H01L 51/0096* (2013.01); *H01L 51/5253* (2013.01); *Y02E 10/549* (2013.01); *Y10T 428/24942* (2015.01); *Y10T 428/24975* (2015.01); *Y10T 428/31765* (2015.04); *Y10T 428/31786* (2015.04); *Y10T 428/31935* (2015.04); *Y10T 428/31938* (2015.04)

(58) Field of Classification Search
    CPC ..... Y10T 428/31786; Y10T 428/24942; Y10T 428/24975; G02B 1/00–1/18; G02B 5/00–5/32; G02F 1/00–1/397
    See application file for complete search history.

(56) References Cited

U.S. PATENT DOCUMENTS

| | | | |
|---|---|---|---|
| 2004/0046909 A1* | 3/2004 | Sekiguchi | G02F 1/13452 349/113 |
| 2004/0160178 A1* | 8/2004 | Qiu | H01L 51/5256 313/512 |
| 2004/0209126 A1* | 10/2004 | Ziegler | B32B 27/06 428/702 |
| 2005/0079380 A1 | 4/2005 | Iwanaga | |
| 2005/0181146 A1 | 8/2005 | Yoneyama et al. | |
| 2010/0187986 A1* | 7/2010 | Kajitani | H01L 51/5253 313/504 |
| 2010/0297365 A1* | 11/2010 | Curd | B32B 7/02 428/1.1 |
| 2010/0304113 A1* | 12/2010 | Chang | B82Y 30/00 428/220 |

FOREIGN PATENT DOCUMENTS

| | | | |
|---|---|---|---|
| JP | 2005-125731 | | 5/2005 |
| JP | 2005-285563 | | 10/2005 |
| JP | 2005-317309 | | 11/2005 |
| JP | 2006035737 A | * | 2/2006 |
| JP | 2007-015350 | | 1/2007 |
| JP | 2007-076207 | | 3/2007 |
| JP | 2010-156982 | | 7/2010 |
| JP | 2010184477 A | | 8/2010 |
| JP | 2011-238355 | | 11/2011 |

OTHER PUBLICATIONS

"What Are Silicones". https://sehsc.americanchemistry.com/sehsc/What-Are-Silicones/. Retrieved Sep. 16, 2016.*
"Surface Energy Data for PMMA: Polymethylmethacrylate, CAS# 9011-14-7". https://www.accudynetest.com/polymer_surface_data/pmma_polymethylmethacrylate.pdf. Retrieved Sep. 16, 2016.*
Machine translation of JP2006035737. Retrieved Jun. 23, 2017.*
International Search Report, PCT/JP2013/058506, May 7, 2013.
Japanese Office Action dated Oct. 17, 2017; Application No: 2014-507850.

* cited by examiner

TRANSPARENT SUBSTRATE FOR OPTICAL ELEMENTS, POLARIZER PLATE FOR LIQUID CRYSTAL DISPLAY DEVICE USING SAID SUBSTRATE, AND ORGANIC ELECTROLUMINESCENCE ELEMENT

TECHNICAL FIELD

The present invention relates to a transparent substrate for optical elements, as well as a polarizer plate for a liquid crystal display device and an organic electroluminescence element.

BACKGROUND

Since optical elements used in slimming devices such as organic electroluminescence (organic EL) illumination devices or liquid crystal display devices are required to have high light transmission, transparency and stiffness, a glass substrate is employed as a substrate for optical elements. However, such a glass substrate is fragile, as well as is not easy to manufacture and handle it. As more miniaturization, slimming, lightweight and further flexibility are required for such optical devices, a transparent and flexible resin film may be usefully used instead of a glass substrate because the resin film is capable of winding as a roll, is easy to handle, is efficiently manufactured, has an improved design properties, and is inexpensive.

Meanwhile, since resin films transmit gas such as water vapor, for optical elements using a resin substrate instead of a glass substrate, water vapor transmitting the resin substrate permeates the interior of optical elements, resulting in degrading optical elements. Specifically, for organic EL illumination devices using an organic EL element in which a light-emitting membrane comprising organic EL is formed on a resin substrate, the organic EL is reacted with electrode components in the presence of water and converted into a material little involvement in light-emitting. As a result, parts without emitting light, i.e., so-called dark spots appear as stains on a surface light source, resulting in lowering illumination quality.

Also, for liquid crystal display devices having a liquid crystal panel using a polarizer plate which equips a polarizing film on a resin substrate, as viewed in an oblique direction (oblique sight), contrast deterioration or color mismatching (chromaticity mismatching) by light-leak phenomena is caused. This condition is more significant under high temperature and high moisture. This is attributable to the following reasons: for example, decomposing a complex of polyvinylalcohol (PVA) and iodine constituting a polarizer contained in a polarizing film by water transmitting a resin substrate or permeating a side of the resin substrate; altering optical anisotropy of a polarizing film by a dimensional change due to absorption and discharge of water; or deteriorating functionality of an optical compensation plate provided between a substrate and a polarizing film to enlarge a viewing angle and further producing cracks in the optical compensation plate. Examples of complexes used as a polarizer may include $I_5$-PVA complexes which exhibit a peak around 600 nm, a broad absorption band, red color upon decomposition, and easy decomposition under high temperature and high moisture; $I_3$-PVA complexes which exhibit a peak around 480 nm, a broad absorption band, and blue color upon decomposition; or the like.

In the field of resin substrates used in such optical elements, substrates having improved gas barrier properties are being developed. Specifically, for organic EL elements, there have been reported an organic EL element in which a silicone oxide nitride is provided on a film such as a polyester film (Patent document 1); an organic EL element using a gas-barrier film which has a stress-relief layer such as polysilazane having a particular thermal expansion coefficient and a gas-barrier layer such as silica on a film such as polyethyleneterephtalate (Patent document 2); an element body such as an organic EL element having function to transfer permeated water to the other side of element side by using a resin substrate having an inorganic layer such as silicon nitride and an organic film layer comprising a lower contact angle layer and a higher contact angle layer(Patent document 3).

Further, it has been reported a polarizer plate for liquid crystal display devices having improved gas-barrier properties, manufactured by forming a layer of silicon oxide having a particular contact angle on a transparent substrate film and laminating a polarizing element thereon (Patent document 4).

However, in case of conventional transparent substrates for optical elements, cracks may be easily generated in an inorganic layer comprising silicon oxide or the like formed on a resin film of a substrate and further stripping may be caused. As a result, gas-barrier properties are lowered. Thus, there is a need for a transparent substrate for optical elements which is capable of inhibiting water vapor permeation through a resin substrate sufficiently.

PRIOR ART DOCUMENTS

Patent Documents

Patent document 1: JP-A 2007-15350
Patent document 2: JP-A 2011-238355
Patent document 3: JP-A 2005-285563
Patent document 4: JP-A 2005-317309
Patent document 5: Patent No. 2997741

SUMMARY OF THE INVENTION

Problems to be Solved by the Invention

It is an object of the present invention to provide a transparent substrate for optical elements which is capable of suppressing cracking, and more particularly to provide a transparent substrate for optical elements which is capable of extending the life of optical elements such as organic EL elements used in organic EL illumination devices or polarizer plates used in liquid crystal display devices.

Means to solve the problems

The present invention relates to a transparent substrate for optical elements characterized by having an inorganic layer and a hydrophilic layer laminated sequentially on a transparent resin film, as well as a polarizer plate used in a liquid crystal display device, an organic electroluminescence element, a liquid crystal display device, and an organic electroluminescence illumination device using the same.

Effects of the Invention

According to the present invention, a transparent substrate for optical elements is capable of suppressing cracking. Further, when applying to optical elements such as an organic EL element used in an organic EL illumination device or an polarizer plate used in a liquid crystal display device, the transparent substrate for optical elements is capable of extending the life of these organic EL elements or liquid crystal display devices.

BRIEF DESCRIPTION OF THE INVENTION

Figure 1:
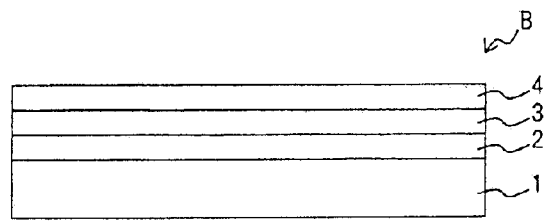
FIG. 1 is a schematic view showing an example of a transparent substrate for optical elements according to the present invention.

THE DESCRIPTION OF REFERENCE NUMBERS 1 resin film
2, 2a, 2b, 2c inorganic layer
3 hydrophilic layer (resin layer)
4 hydrophobic layer (resin layer)
B transparent substrate for optical elements
20 organic layer
30 polarizing film
31 protective film (resin film)

DETAILED DESCRIPTION OF THE INVENTION

According to the present invention, a transparent substrate for optical elements is characterized by having an inorganic layer and a hydrophilic layer laminated sequentially on a transparent resin film. For this reason, this transparent substrate for optical elements can have excellent gas barrier properties, inhibits degeneration of optical elements due to water vapor, is transparent and flexible, is easy to handle, can be efficiently and economically manufactured, has excellent design properties, and can suppress cracking.

A resin film used in the transparent substrate for optical elements may be any resin film as long as it is transparent and can laminate and support optical elements thereon. If a resin film is used in a polarizer plate, it has preferably low optical anisotropy. Specifically, those comprising polyesters such as polyethylenenaphthalate (PEN) or polyethyleneterephthalate (PET), acrylic resins, polyethersulfone (PES), triacetyl cellulose (TAC) or the like are preferred.

The resin film has a transparency level same as that of a laminated optical element.

The resin film has a thickness that allows strength capable of supporting an optical element laminated.

An inorganic layer formed on the resin film comprises an inorganic compound and has moisture-proofing properties to inhibit water vapor permeation. The inorganic layer may be provided on the interior of the resin film in which optical elements are provided, the exterior of the resin film, or both. Examples of the inorganic compound may include any one or two or more species selected from silicon oxides (SiOx), silicon nitrides (SiNx) and silicon nitride oxides (SiNxOy). A layer comprising these inorganic compounds has low transmittance to gas such as water vapor and can suppress water vapor permeation through the optical element. Among these, silicon nitride is particularly preferred because it can form an inorganic layer having high gas-barrier properties.

The inorganic layer may configure a single layer or multiple layers structure. Specifically, the inorganic layer may have, for example, a rigid moisture-proofing layer with high gas-barrier properties comprising silicon nitride or silicon nitride oxide and a low hardness relief layer with relatively low remaining stress comprising silicone oxide or silicon nitride oxide, or silicon oxide and silicon nitride oxide.

Further, in case of the inorganic layer having multiple layers, by using each layer having a different refractive index, it is possible to function as an optical interference layer to suppress reflection of light from outside or transmitted light from inside. Specifically, a lower layer, an intermediate layer and an upper layer may be formed sequentially from the resin film, and a refractive index may be increased in the order of the upper layer, the lower layer and the intermediate layer, thereby promoting the transmission of incident light entering the inorganic layer and suppressing the reflection of the incident light without an antireflection layer.

A hydrophilic layer formed on the inorganic layer is preferably a resin layer having flexibility so that cracking can be suppressed in the inorganic layer having high remaining stress during manufacture. Further, it is preferred to provide a hydrophobic layer formed from a resin on the hydrophilic layer in order to achieve a high water-trapping effect and suppress a dimensional change. The hydrophobic layer may be provided on a side opposed a side having the hydrophilic layer.

Preferably, the hydrophilic layer comprises any one or two or more species selected from an acrylic resin, a polyamide resin and a polyester resin. The acrylic resin may be homopolymers or copolymers comprising ethyl methacrylate, methyl methacrylate, ethyl acrylate, methyl acrylate and the like as monomers. Also, the acrylic resin may be polymers comprising monomers other than the foregoing monomers. The polyamide resin may include nylon or the like. The polyester resin is preferably polyethyleneterephthalate. If necessary, the polyester resin may be treated to increase hydrophilicity.

Preferably, the hydrophobic layer comprises any one or two or more species selected from an olefin resin, an alicyclic olefin resin, an acrylic resin, a polyester resin and a fluororesin. The olefin resin may include chain-type polymers such as ethylene, propylene or the like. The alicyclic olefin resin may include cyclic polyolefins such as copolymers of norbornene and ethylene. The acrylic resin may be homopolymers or copolymers comprising ethyl methacrylate, methyl methacrylate, ethyl acrylate, methyl acrylate or the like as monomers.

Also, the acrylic resin may be polymers comprising monomers other than the foregoing monomers. Hydrophobicity may be adjusted depending on a molar ratio of monomers. In addition, if the acrylic resin is used in the hydrophilic layer, the hydrophobic layer may have high hydrophobicity relative to the hydrophilic layer. The fluororesin is preferably polytetrafluoroethylene.

By using the hydrophilic layer and the hydrophobic layer with such material properties, these layers are synergistically interacted to suppress water vapor permeation through optical element, alleviate the remaining stress in the inorganic layer with material properties as indicated above, and suppress cracking.

An example of the transparent substrate for optical elements is shown in FIG. 1. The transparent substrate for optical elements (B) shown in FIG. 1 has a structure that an inorganic layer (2), a hydrophilic layer (3) and a hydrophobic layer (4) are sequentially laminated on a flexible film (1) as a transparent resin film.

The flexible film is preferably made from polyester such as polyethylenenaphthalate or polyethyleneterephthalate, polyethersulfone, acrylic resin, triacetyl cellulose, or the like.

The inorganic layer comprises any one or two or more species selected from silicone oxide, silicon nitride, or silicon nitride oxide. The inorganic layer is shown in FIG. 1 as a single layer, but it is preferred to form as two or more layers including a moisture-proofing layer with high gas-barrier properties comprising silicon nitride or silicon nitride oxide and a low hardness relief layer comprising silicon oxide or silicon nitride oxide. Preferably, the inorganic layer has a thickness of 5-500 nm, and more preferably 10-400 nm. If the inorganic layer has a thickness of 5 nm or more, it may have high moisture resistance. If the inorganic layer has a thickness of 500nm or less, the resulting transparent substrate for optical elements has flexibility, so that cracking or stripping can be suppressed.

The hydrophilic layer has functions to trap water permeating through the inorganic layer, reduce water permeation into the interior of organic EL elements, and alleviate the remaining stress in the inorganic layer. Preferably, the hydrophilic layer is a resin layer comprising any one or two or more species selected from an acrylic resin, a polyamide resin and a polyester resin. These resins are not easily hydrolyzed in the presence of water while they are hydrophilic resins, and they preferably have compatibility with the inorganic layer. The acrylic resin may be homopolymers or copolymers comprising ethyl methacrylate, methyl methacrylate, ethyl acrylate, methyl acrylate or the like as monomers. Also, the acrylic resin may be polymers comprising monomers other than the foregoing monomers. As the polyamide resin, transparent, amorphous or copolymeric nylon resins may be used. The polyester resin is preferably polyethyleneterephthalate. Among these, PET is inexpensive, is easy to handle, and has high mechanical strength, dimensional stability and solvent resistance. However, when using in the transparent substrate for optical elements, acrylic resins having excellent transparency and high light resistance, in particular versatile polymethyl methacrylate is preferred. The foregoing resin layer, or the foregoing resin materials may be further treated by hydrophilic treatment. The hydrophilic treatment may include atmospheric plasma treatment, irradiation of ion beam such as Ar, reformation by treatment with sulfuric acid, silane coupling treatment, copolymerization with polyethylene glycol or the like. In particular, since polyethyleneterephthalate has relatively high hydrophobicity compared to the other two materials, it is suitable to use as the form of a copolymer.

The hydrophobic layer can alleviate stress in the inorganic layer and should have water resistance. Thus, the hydrophobic layer comprises preferably any one or two or more species selected from an olefin resin, an alicyclic olefin resin, an acrylic resin, a polyester resin and a fluororesin. The olefin resin may include chain-type polymers such as ethylene, propylene or the like. The alicyclic olefin resin may include cyclic polyolefins such as copolymers of norbornene and ethylene. The acrylic resin may be homopolymers or copolymers comprising ethyl methacrylate, methyl methacrylate, ethyl acrylate, methyl acrylate or the like as monomers. Also, the acrylic resin may be polymers comprising monomers other than the foregoing monomers. The fluororesin may include polychlorotrifluoroethylene, copolymer of tetrafluoroethylene and ethylene (ethylene•tetrafluoroethylene copolymer), copolymer of tetrafluoroethylene and hexafluoroethylene (tetrafluoroethylene•hexafluoropropylene copolymer). Among these, cyclic polyolefins such as copolymers of norbornene and ethylene are preferred.

These hydrophilic layer and hydrophobic layer are preferably thin to slim a thickness of optical elements for which they are used. Preferably, the hydrophobic layer has a thickness of 10-1000 nm, and more preferably 150-1000 nm Preferably, the hydrophilic layer has a thickness of 90-1000 nm, and more preferably 200-1000 nm. A total thickness of the hydrophobic layer and the hydrophilic layer is preferably 100-2000 nm.

Although not shown, the transparent substrate for optical elements may have additional layers as long as they do not negatively affect functions of the transparent substrate for optical elements. Such additional layers may be a hardcoat layer, an antireflection layer, an antiglare-preventing layer, an antistatic layer or the like onto the hydrophobic layer. The hardcoat layer may be formed as a cured layer from a UV curable resin such as a silicon resin comprising titanium dioxide particles. The antireflection layer may be provided by coating fluororesin materials having different refractive indexes, or depositing silicon oxide or titanium oxide. The antiglare-preventing layer may be formed by coating liquid comprising particulates, or performing sand blast or embossing on a surface. The antistatic layer may be formed by coating liquid comprising particulates having a desired conductivity.

As a method for manufacturing the transparent substrate for optical elements, firstly, an inorganic layer may be formed on a transparent resin film, for example by a film formation method such as plasma CVD, sputtering, vapor deposition, ion plating, sol-gel, or the like. Preferably, the inorganic layer is formed using a plasma CVD method since continuous film formation is possible; a temperature of a resin film is precisely controlled; a dense film is obtained; or the like. Then, a hydrophilic layer may be formed, for example by a method such as wet coating, dip coating, sol-gel, or the like. Depending on materials, a film formation process in vacuum vapor deposition polymerization may be used. In addition, as another method for manufacturing a hydrophilic layer having multiple layers, individual sheets may firstly be formed, and then these sheets may be bonded using an adhesive such as an acrylic adhesive. By doing so, the procedure may be simplified and productivity may be improved. A hydrophobic layer may be also manufactured using the same methods as described for the hydrophilic layer.

Figure 2:
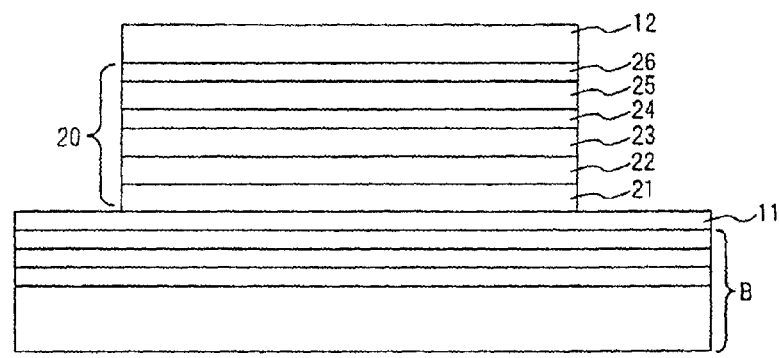
FIG. 2 is a schematic view showing an organic EL element using the transparent substrate for optical elements according to the present invention as shown in FIG. 1.

As an example of optical elements for which the transparent substrate for optical elements is applied, an organic EL element will be now described with reference to FIG. 2. A transparent substrate for optical elements (B) shown in FIG. 1 is used in the organic EL element shown in FIG. 2. In this case, a transparent electrode layer (11), an organic layer (20) comprising an organic EL material and an electrode layer (12) mated with the transparent electrode layer are provided onto a hydrophobic layer (4) of the transparent substrate for optical elements.

The transparent electrode layer may supply carriers of either holes or electrons, and is preferably formed from a material having high transmission rate of light from a light-emitting layer. For example, the transparent electrode layer may be formed from indium tin oxide (ITO), indium zinc oxide (IZO), or the like as a positive electrode for supplying holes. The transparent electrode layer may have, for example a thickness of 100-300 nm.

The organic layer (20) has a hole injection layer (21), a hole transporting layer (22), a light-emitting layer comprising organic EL (23), a hole blocking layer (24), an electron transporting layer (25), and an electron injection layer (26).

The hole injection layer is provided to reduce a height of an injection barrier to holes injected from the transparent electrode layer to the organic layer, alleviate a difference in energy level between the positive electrode and the hole transporting layer, and facilitate the injection of holes injected from the positive electrode to the hole transporting layer. As materials for the hole injection layer from which the hole injection layer is formed, examples may include copper phthalocyanine or arylamine derivatives such as starburst-type aromatic amines, or these materials having doped an inorganic substance such as vanadium pentoxide or molybdenum trioxide or an organic substance such as $F_4$-TCNQ to reduce the injection barrier and lower driving voltage.

The hole transporting layer is provided to increase the migration rate of holes to the light-emitting layer. Materials for the hole transporting layer are preferred those having suitable ionization potential and electron affinity to prevent electrons from being leaked from the light-emitting layer. Examples may include triphenyldiamines such as bis(di(p-tolyl)aminophenyl)-1,1-cyclohexane, TPD, N,N'-diphenyl-N—N-bis(1-naphthyl)-1,1'-biphenyl)-4,4'-diamine($\alpha$-NPD) or the like, or starburst-type aromatic amines.

The light-emitting layer is used to recouple holes to electrons injected from the electrodes and emit fluorescence and/or phosphorescence. Materials of the light-emitting layer, examples may include low molecular weight compounds such as tris(8-quinolinol)aluminum complex ($Alq_3$), bisdiphenylvinylbiphenyl (BDPVBi), 1,3-bis(p-t-butylphenyl-1,3,4-oxadiazolyl)phenyl (OXD-7), N,N'-bis(2,5-di-t-butylphenyl)perylene tetracarboxylic diimide (BPPC), 1,4-bis(N-p-tolyl-N-4-(4-methylstyryl)phenylamino) naphthalene or the like, or high molecular weight compounds such as polyphenylenevinyl-based polymers or the like.

As other light-emitting materials, materials which comprises binary components of a host and a dopant, and emits light from a dopant molecule by transferring excitation energy generated by a host molecule to the dopant molecule may be used. As such binary light-emitting materials, the foregoing light-emitting materials, electron transporting materials or hole transporting materials may be used. For example, those in which a host quinolinol metal complex such as Alq3 is doped with 4-dicyanomethylene-2-methyl-6-(p-dimethylaminostyryl)-4H-pyrano (DCM), a quinacridone derivative such as 2,3-quinacridone, or a coumarin derivative such as 3-(2'-benzothiazole)-7-diethylamino coumarin as a dopant; a host electron transporting material bis(2-methyl-8-hydroxyquinoline)-4-phenylphenol-aluminum complex is doped with a condensed polycyclic aromatic compound such as perylene as a dopant; a host hole transporting material 4,4'-bis(m-tolylphenylamino)biphenyl (TPD) is doped with rubrene as a dopant; or a host carbazol compound such as 4,4'-biscarbazolylbiphenyl (CBP) or 4,4'-bis(9-carbazolyl)-2,2'-dimethylbiphenyl (CDBP) is doped with a platinum complex or an iridium complex such as tris-(2-phenylpyridine)iridium complex ($Ir(ppy)_3$), (bis(4,6-di-fluorophenyl)-pyridinate-N,C2')picolinate iridium complex (FIr(pic)), (bis(2-(2'-benzo(4,5-$\alpha$)thienyl)pyridinate-N, C2')(acetylacetonate)iridium complex ($Btp_2Ir(acac)$), $Ir(pic)_3$ or $Bt_2Ir(acac)$ as a dopant.

These light-emitting materials may be selected depending on a light-emitting color intended for an organic EL illumination device using organic EL elements. Specifically, for green color, $Alq_3$ and a dopant such as quinacridone or coumarin, $Ir(ppy)_3$ or the like may used; for blue color, DPVBi and a dopant such as perylene, distyrylarylene derivatives, FIr(pic) or the like may be used; for green-bluegreen color, a dopant such as OXD-7 or the like may be used; for red-orange color, a dopant such as DCM, DCJTB, $Ir(pic)_3$ or the like may be used; for yellow color, a dopant such as rubrene, $Bt_2Ir(acac)$ or the like may be used.

To obtain white color light, a combination of host $Alq_a$ and guest DCM (orange color) may be used as light-emitting materials.

Also, white color light may be obtained by a light-emitting layer formed as a three-layer lamination structure in which each layer contains a light-emitting material emitting red, green or blue color, respectively; or a two-layer lamination structure in which each layer contains a light-emitting material emitting blue or yellow, respectively, as complementary colors; or a single-layer structure comprising mixed light-emitting materials formed by co-depositing these light-emitting materials for each color. Further, a light-emitting layer may be formed by arranging the light-emitting material corresponding to each color layer in the three-layer or two-layer lamination structure sequentially as fine pixels of red, blue, green and the like.

The hole blocking layer is provided to block holes passing through the light-emitting layer without emitting light and enhance recoupling holes to electrons in the light-emitting layer. Materials of the hole blocking layer may be used 2,9-dimethyl-4,7-diphenyl-1,10-phenanthroline (BCP), triphenyldiamine derivatives, triazole derivatives or the like.

The electron transporting layer is provided to increase the migration rate of electrons to the light-emitting layer. Materials of the electron transporting layer are preferred those having suitable ionization potential and electron affinity to prevent holes from being leaked from the light-emitting layer. Examples may include organic materials, for example oxadiazole derivatives such as 2-(4-biphenylyl(biphenylyl))-5-(4-t-butylphenyl)-1,3,4-oxadiazole (Bu-PBD) or OXD-7, triazole derivatives, quinolinol-based metal complexes or the like, or the foregoing organic materials doped electron donor materials including alkali metals such as lithium.

The electron injection layer is provided to facilitate the injection of electrons from the electrode layer to electron transporting layer as the injection is difficult due to a large energy difference between the work function of a metal material such as aluminum used in forming the negative electrode layer and the electron affinity (LUMO level) of the electron transporting layer. Materials of the electron injection layer have low work function, for example alkali metals such as lithium or cesium, or fluorides or oxides of alkali earth metals such as calcium, or alloys such as magnesium silver or lithium aluminum may be used.

For example, each of the organic layers provided between the electrode layers may have a thickness of 1-500 nm, the total thickness being 100-1000 nm.

The electrode layer mated with the transparent electrode layer is not particularly limited in light transmission. If the transparent electrode layer is formed from the foregoing light-transmitting electrode materials, the electrode layer is preferably formed as a light-shielding negative electrode using a metal thin film such as aluminum, silver or the like, in order to reflect light emitting from the organic layers toward a side of the light-transmitting electrode layer and suppress a reduction in amount of light emitting from a light-emitting surface. A thickness of the electrode layer is preferably thick in consideration of a voltage drop due to wire resistance, for example, the thickness being 50-300 nm. Also, the negative electrode may be formed from the light-transmitting electrode materials, and in this case, a transparent organic EL element may be produced. To form connections with wire members in one end of the electrode layer, the one end may be preferably extended.

A method for manufacturing such organic EL elements will be now described. A transparent electrode layer is formed on a desired region of the transparent substrate for optical elements. The transparent electrode may be formed by patterning a light-transmitting electrode film uniformly formed from a material for the transparent electrode layer through a shadow mask, by a method such as sputtering, vapor deposition or CVD, or by photolithography. To form connections with wire members in one end of the transparent electrode layer, the one end may be preferably extended.

The electron injection layer, the electron transporting layer, the light-emitting layer, the hole transporting layer, the hole injection layer, and the hole blocking layer, hereinafter, they are collectively referred to as the organic layers, may be formed using the forgoing materials as a desired shape through a shadow mask by a vapor deposition method with resistance heating, a MBE method or a laser ablation method. Also, if polymer materials are used in forming these layers, a desired shape may be formed by an inkjet method using a liquid material, or alternatively a desired shape may be formed by spin coating or slit coating a photosensitive coating liquid followed by photolithography.

The other electrode layer mated with the transparent electrode layer may be formed by a method such as vapor deposition or sputtering using the foregoing material on the organic layers which have bee already formed. To form connections with wire members in one end of the electrode layer, the one end may be preferably extended.

In case of the organic EL element, by using the transparent substrate for optical elements, water vapor permeated through a resin film cannot further transmit by the inorganic layer, and water vapor permeated through the inorganic layer, if any, is trapped by the hydrophilic layer as well as is limited in permeation by the hydrophobic layer of the upper layer. The remaining stress in manufacturing the inorganic layer is absorbed by the hydrophilic layer and the hydrophobic layer, thereby suppressing stripping or cracking. As a result, the organic EL element having low dimensional change between a substrate for optical elements and an organic EL element, suppressed generation of dark spots even under high temperature and high moisture, and extended life can be obtained.

Also, for an organic EL illumination device in which the organic EL element is applied, a lighting circuit, a control circuit for the lighting circuit and the like are provided, these circuits being connected via wiring connected to connections formed by extending one end of each of the transparent electrode layer and the mated electrode layer of the organic EL element. An external power supply may be provided for the transparent electrode layer and the electrode layer therethrough. The wiring having a width over the entire width of one end of the electrodes may be used to suppress an increase in resistance of the connections. As the wiring, a flexible film such as copper polyimide may bee used. Such an organic EL illumination devices may be applied to a backlight for a liquid crystal display or the like.

As another example of optical elements in which the transparent substrate for optical elements is applied, a polarizer plate used in a liquid crystal panel of a liquid crystal display device will be now described with reference to FIG. 3. The transparent substrate for optical elements (B) shown in FIG. 1 is applied to the polarizer plate shown in FIG. 3, wherein an inorganic layer (2), a hydrophilic layer (3) and a hydrophobic layer (4) are sequentially laminated on one side surface of the resin film (1), and a polarizing film (30) and a protective film (31) are provided on a rear surface of the resin film (1).

As the transparent substrate for optical elements (B), the resin film has preferably high transparency and low optical anisotropy, and may include acrylic resins, triacetyl cellulose or the like. The resin film has preferably a thickness of 20-300 μm.

The polarizing film (30) comprises preferably a polyiodine complex formed by cross-linking polyvinylalcohol and iodine with boric acid. It is suitable to use a film made by forming a polyiodine complex film and stretching to exhibit polarization. The polarizing film has a thickness of 15-150 μm, preferably 20-300 μm.

The protective film (31) is provided to protect the polarizing film, and is preferably formed from a material having high transparency and low optical anisotropy, for example triacetyl cellulose, polyethyleneterephtalate, acrylic resin. The protective film (31) has preferably a thickness of 20-300 μm.

Now, a method for manufacturing this polarizer plate will be described. A polarizing film is formed by impregnating an iodine compound into a polyvinylalcohol film, drawing the polyvinylalcohol film uniaxially, and cross-linking with boric acid. Then, a protective film is adhered on an inner surface of the polarizing film in which liquid crystal is provided and the transparent substrate for optical elements is adhered on an outer surface of the polarizing film through an acrylic adhesive layer of 10-20 μm thickness, so that a polarizer plate is obtained.

By doing so, it is possible to obtain a polarizer plate which can suppress water vapor permeation through the polarizing film, suppress degradation of a polyiodine complex as a polarizer, reduce a variation in the polarization degree of the polarizing film and a dimensional change, and suppress contrast deterioration or color mismatching due to light-leak phenomena when viewed in an oblique direction, in particular, under high temperature and high moisture, as well as is stable for long term and has high reliability and long life.

This polarizer plate may be applied to a liquid crystal panel which is embedded in a liquid crystal display device. The liquid crystal panel may have a structure that liquid crystal is sealed between a color filter substrate and an array substrate, and the polarizer plate is laminated onto each of the color filter substrate and the array substrate. In a liquid crystal side of the color filter substrate, pixels of red, green and blue are arranged in a black matrix and a transparent electrode made from indium tin oxide (ITO) and the like is formed. In a liquid crystal side of the array substrate, a thin film transistor (TFT) and a transparent electrode are formed. An orientation film made from polyimide and the like is formed on an interior of these transparent electrodes to allow the liquid crystal to have a desired orientation. By forming the color filter substrate and the array substrate using a resin film, a liquid crystal panel having flexibility may be provided.

A liquid crystal display device using the liquid crystal panel is provided with a power source, a driving circuit, a power circuit and the like. A display operation is performed by scattering light radiated in 360° directions from a light source to a rear surface of the liquid crystal panel through a light guide plate, followed by introducing light having amplitude in a particular direction into the liquid crystal through the polarizer plate, and absorbing other light in iodine in the polarizer, and transmitting between oriented liquid crystal by voltage applied between the transparent electrodes.

In case of this liquid crystal display device, degradation of the polarizer can be suppressed, deterioration of polarization degree and coloration or light-leak of the polarizer plate can be suppressed, and water vapor permeation through the liquid crystal panel can be suppressed even when a resin substrate is used as substrates between which a liquid crystal is sandwiched.

EXAMPLES

Hereinafter, the organic EL element according to the present invention will be described in detail.

Example 1

A transparent substrate for optical elements was manufactured as follows: 100 μm thick polyethylenenaphthalate (TEONEX Q65FA; made by Teijin DuPont Films Japan Limited) was used as a flexible film (1), and a silicon nitride film layer (2), a hydrophilic layer (3) and a hydrophobic layer (4) were sequentially laminated on the flexible film (1). The silicon nitride film was formed as a transparent inorganic film having 100 nm thickness by introducing $SiH_4$, $NH_3$, $H_2$ and $N_2$ gases at flow rates of 10, 20, 200 and 200 sccm, respectively, at substrate temperature 100° C., internal pressure 120 Pa, power source frequency 13.56 MHz and input power 500W using a plasma CVD device. Then, a hydrophilic layer was formed. A coating was performed by a spin coating method using methyl methacrylate as a monomer, propylene glycol monomethyl ether acetate as a solvent, a methacrylic ester monomer as a cross-linking agent, a modified polyacrylate as a dispersion-leveling agent, and a benzophenone-based initiator as an initiator. After spinning at 2000 rpm for 20 seconds, reduced-pressure drying was performed at 0.6 kpa for 90 seconds, and further heat drying was performed at 90° C. for 5 minutes. UV was irradiated at the integrated beam dose of 2000 mJ/cm² by a high pressure mercury lamp, and calcinations was further performed at 110° C. for 40 minutes to obtain a coating film having 500 nm thickness. Then, a hydrophobic layer was formed. A coating was performed by a spin coating method using 5-methyl-2-norbornene as a monomer, ethylbenzene as a solvent, a ketone peroxide as a cross-linking agent, a modified polyacrylate as a dispersion-leveling agent, 2-hydroxyethylmethacrylate as a light reactive monomer, and a benzophenone-based initiator as an initiator. After spinning at 2000 rpm for 20 seconds, reduced-pressure drying was performed at 1.3 kpa for 120 seconds, and further heat drying was performed at 60° C. for 5 minutes. UV was irradiated at the integrated beam dose of 2000 mJ/cm² by a high pressure mercury lamp, and calcinations was further performed at 110° C. for 30 minutes to obtain a coating film having 500 nm thickness.

The resulting transparent substrate for optical elements has water vapor permeability of $10^{-5}$-$10^{-6}$ g/m²/day, as measured by a water vapor permeability tester (made by MOCON).

A transparent organic EL illumination panel was formed on the transparent substrate for optical elements according to the following conditions. The organic EL illumination panel was manufactured as shown in FIG. 2, by using indium tin oxide (ITO) as a transparent electrode, Cu—Pc (copper phthalocyanine) as a hole injection material, α-NPD(N,N'-diphenyl-N—N-bis(1-naphthyl)-1,1'-biphenyl)-4,4'-diamine) as a hole transporting material, CBP(4,4'-biscarbazolylbiphenyl) having doped $Ir(ppy)_3$(tris-(2-phenylpyridine)iridium complex), $Btp_2Ir(acac)$(bis(2-(2'-benzo(4,5-α)thienyl)pyridinate-N,C2')(acetylacetonate) iridium complex) and further CBP having doped FIr(pic) (bis(4,6-di-fluorophenyl)-pyridinate-N,C2')picolinate iridium complex) as a light-emitting material, BCP(2,9-dimethyl-4,7-diphenyl-1,10-phenanthroline) as a hole blocking layer, $Alq_a$ as an electron transporting layer, LiF as an electron injection material, and Al as an negative electrode.

When lighting at the constant current of 25 A/m² as a driving current, a driving voltage was 4.6V and luminance was 980 cd/m².

Figure 4:
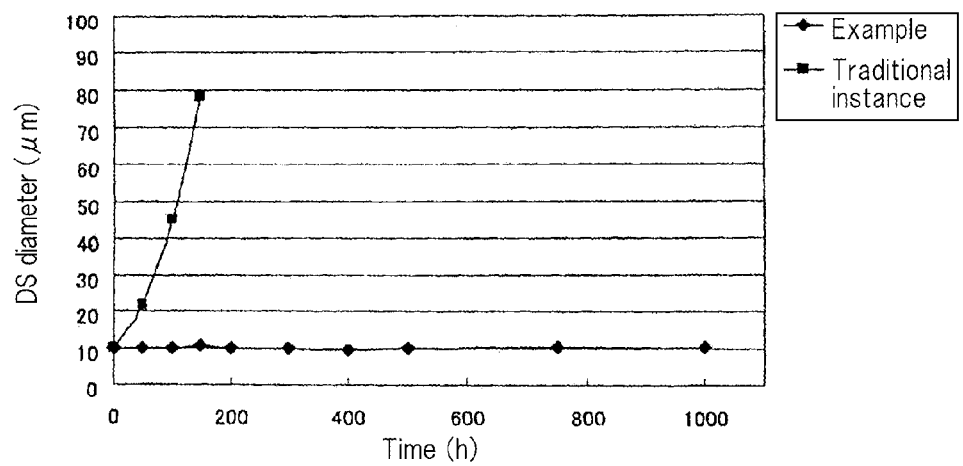
FIG. 4 is a view showing dark spots generated under high temperature and high moisture of an organic EL panel using the organic EL element shown in FIG. 2.

The following high temperature and high moisture test was performed on the resulting organic EL illumination panel. After the organic EL illumination panel was placed under the environment of 85° C., 85% humidity, cracking was observed in the transparent substrate for optical elements, and dark spots and shrinking in the light-emitting part were observed under periodic lighting. The results were shown in FIG. 4. After 1000 hours, dark spots, shrinking in the light-emitting part as well as cracking in the transparent substrate for optical elements were not observed.

Comparative Example 1

An organic EL illumination panel was manufactured using the same method as in Example 1 except for using a bare resin film without an inorganic layer, a hydrophilic layer and a hydrophobic layer, and the high temperature and high moisture test was performed on the resulting product. Relating to generation of dark spots, the result was shown in FIG. 4. Shrinking in light-emitting part was caused, and cracks in the transparent substrate for optical elements were generated and grown. In addition, lighting was not possible by short due to dark spots after 200 hours.

Example 2

Figure 3:
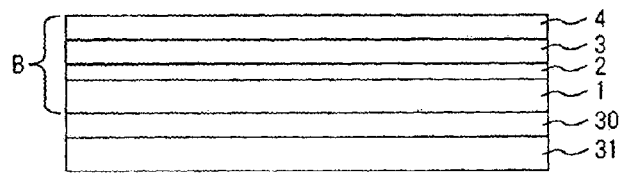
FIG. 3 is a schematic view showing a polarizer plate using the transparent substrate for optical elements according to the present invention shown in FIG. 1.

A polarizer plate as shown in FIG. 3 was manufactured by bonding a transparent substrate for optical elements and a protective film (31) of 70 μm thick triacetyl cellulose film on both surfaces of a polarizer film (30) via 10 μm thick acrylic adhesive layer, respectively, wherein the transparent substrate for optical elements was made by the same method as in Example 1 except for changing the resin film to a 70 μm thick triacetyl cellulose film. The 70 μm thick triacetyl cellulose film was obtained by the following method. A solution of triacetyl cellulose in methylene chloride was uniformly coated on a flat substrate such as stainless, dried under reduced pressure at 47 kPa for 120 seconds, and further dried under heating at 50° C. for 5 minutes. Then, the resulting film was removed from the stainless plate and dried at 150° C. for 10 minutes without any stress on the film, thereby obtaining the 70 μm protective film.

Each of two polarizer plates was adhered to a color filter substrate and an array substrate, respectively, liquid crystal was interposed and supported between these plates to form a liquid crystal panel, the resulting product was embedded in a liquid crystal display device connected to driving circuits such as driver, and the resulting product was derived and left under the environment of 60° C. temperature and 90% humidity. Cracking, light-leak from the liquid crystal panel and color mismatching/coloration (chromaticity mismatching) were periodically observed.

Figure 5:
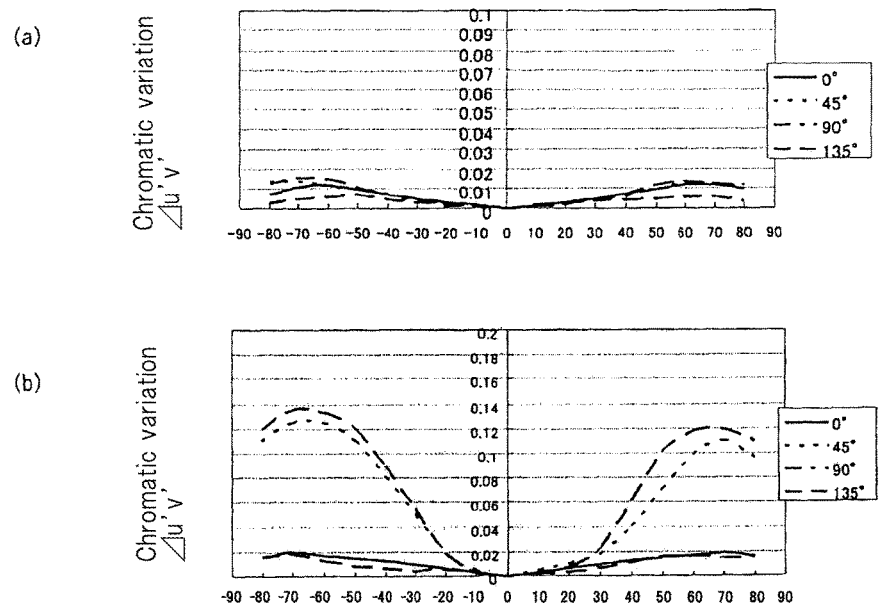
FIG. 5 is a view showing a chromaticity change under high temperature and high moisture of a liquid crystal panel using the polarizer plate shown in FIG. 3.

For the color mismatching/coloration, chromaticity change was measured as follows: the measurement was performed using EZ Contrast (Model No. XL88; made by ELDIM). This instrument can measure brightness/chromaticity at radiation angle±88° and azimuth 360° in a single measurement, and assess viewing angle characteristics. The result was shown in FIG. 5(a). Also, a measurement was performed while rotating a measuring device or a liquid crystal display using a colorimeter (BM-5; made by Topcon), to measure viewing angle dependency of chromaticity.

Figure 6:
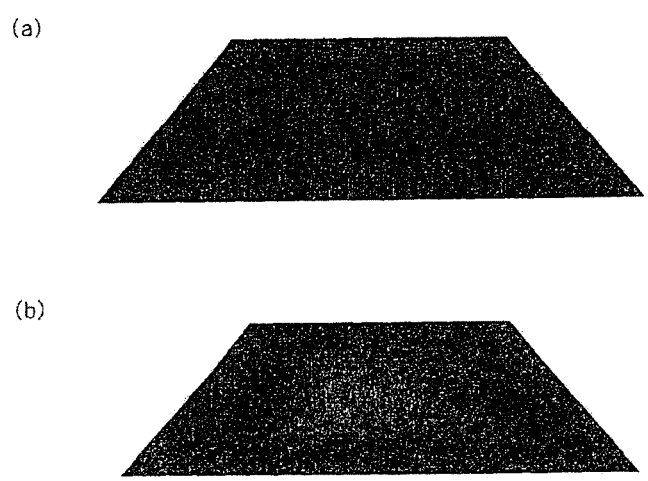
FIG. 6 is a view showing light-leak/color mismatching under high temperature and high moisture of a liquid crystal panel using the polarizer plate shown in FIG. 3.

An image condition from oblique sight in dark display of the liquid crystal panel after 3000 hours was shown in FIG. 6(a). After 3000 hours, light-leak and color mismatching/coloration of the liquid crystal panel were not exhibited, and cracking in the transparent substrate for optical elements were not observed.

Comparative Example 2

A polarizer plate was manufactured using the same method as in Example 2 except for using a bare transparent flexible substrate without an inorganic layer, a hydrophilic layer and a hydrophobic layer, and the high temperature and high moisture test was performed on the resulting panel. Light-leak from the liquid crystal panel, color mismatching/coloration and cracking in the transparent substrate for optical elements were periodically observed. Chromaticity change was shown in FIG. 5(b), and an image condition from oblique sight in dark display of the liquid crystal panel after 1000 hours was shown in FIG. 6(b). Cracking in the transparent substrate for optical elements were exhibited after 1200 hours.

In Example 2, chromaticity change by light-leak from an oblique direction was very low after the high temperature and high moisture, but in Comparative example 2, chromaticity change was very large when viewing from the oblique direction.

Example 3

Figure 7:
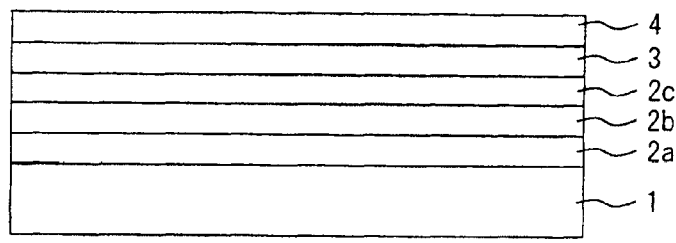
FIG. 7 is a schematic view showing another example of a transparent substrate for optical elements according to the present invention.

As shown in FIG. 7, an inorganic layer was manufactured by the following method, in which a silicon nitride oxide film (first layer) (2a), a silicon nitride film (second layer) (second layer) (2b), a silicon oxide film (third layer) (2c) were sequentially laminated on a resin film (1). The silicon nitride oxide film was formed as a 70 nm thick transparent inorganic film using a plasma CVD device by introducing $SiH_4$, O2 and N2 gases at the respective flow rates of 10, 20 and 200 sccm while maintaining 100° C. substrate temperature and 120 Pa internal pressure at 13.56 MHz power supply frequency and 500 W input power. Then, the silicon nitride film was formed as a 100 nm thick transparent inorganic film by introducing $SiH_4$, $NH_3$, $H_2$ and $N_2$ gases at the respective flow rates of 10, 20, 200 and 200 sccm under the same condition. Further, the silicone oxide film was formed as a 100 nm thick transparent inorganic film by introducing $SiH_4$, $O_2$ and $H_2$ gases at the respective flow rates of 10, 50 and 200 sccm under the same condition.

A transparent substrate for optical elements as shown in FIG. 7 was manufactured by the same method as in Example 1 except for the foregoing procedure. An organic EL illumination panel was manufactured by the same method as in Example 1 using the same, and the high temperature and high moisture test was performed on the resulting product. Cracking in the transparent substrate for optical elements, dark spots in light-emitting part and shrinking were observed.

A lower layer, an intermediate layer and an upper layer which correspond respectively to the first, second and third layers in the inorganic layer of the resulting transparent substrate for optical elements had n=1.6-1.7, n=1.8-2.0 and n=1.4-1.6 as refractive index (n) to 500 nm wavelength light, respectively. Since the refractive index was increased in the order of the upper layer, the lower layer and the intermediate layer, therefore an optical interference film was formed by the median refractive index of the lower layer, the high refractive index of the intermediate layer and the low refractive index of the upper layer, the reflection of external light and transmitted light could be suppressed without an antireflective layer. Further, since the silicon nitride film having high stiffness and high residual stress in film formation was interposed and supported between the silicon nitride oxide film and the silicone oxide film, stress in the silicon nitride film could be effectively alleviated and an organic EL illumination panel having high strength could be obtained without a hard coat layer.

The resulting organic EL illumination panel did not exhibit shrinking in light-emitting part and cracking in transparent substrate for optical elements after 1000 hours under high temperature and high moisture.

Example 4

Figure 8:
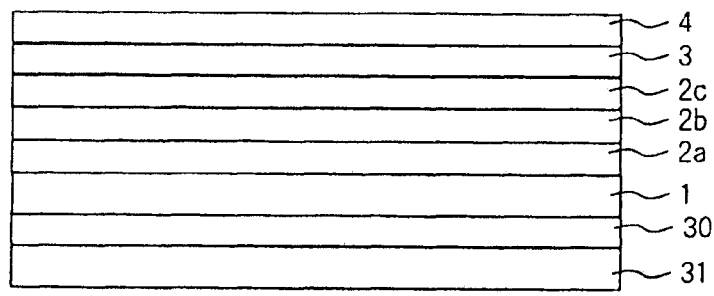
FIG. 8 is a schematic view showing a polarizer plate using the transparent substrate for optical elements according to the present invention shown in FIG. 7.

A polarizer plate as shown in FIG. 8 was manufactured onto the transparent substrate for optical elements used in Example 3 by the same method as in Example 2. A liquid crystal panel was manufactured, and the high temperature and high moisture test was performed. Cracking in the transparent substrate for optical elements, light-leak from the liquid crystal panel and color mismatching/coloration were observed.

After 3000 hours, cracking in the transparent substrate for optical elements, light-leak from the liquid crystal panel and color mismatching/coloration were not observed.

Example 5

Figure 9:
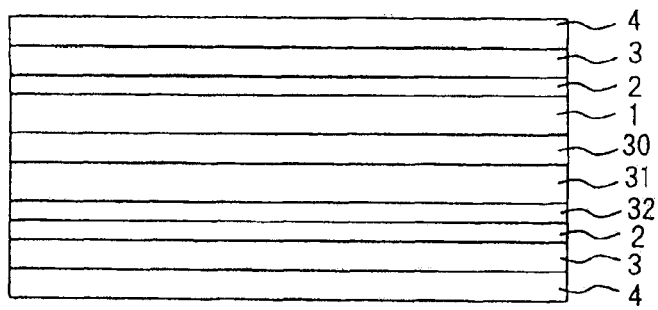
FIG. 9 is a schematic view showing a polarizer plate using the transparent substrate for optical elements according to the present invention.

An optical compensation film (32) were bonded onto the triacetyl cellulose film (31) of the polarizer plate as shown in FIG. 3 obtained in Example 2 via a 10 μm thick acrylic adhesive to form a laminated film. An inorganic layer, a hydrophilic layer and hydrophobic layer were formed onto the optical compensation film using the same method as in Example 1 to manufacture a transparent substrate for optical elements. A transparent substrate for optical elements was formed on a rear surface of the triacetyl cellulose film of the resulting transparent substrate for optical elements using the same method as in Example 1 to manufacture a polarizer plate as shown in FIG. 9. A liquid crystal panel was manufactured by the same method as in Example 2, and the high temperature and high moisture test was performed. Cracking in the transparent substrate for optical elements, light-leak from the liquid crystal panel and color mismatching/coloration were observed.

After 3000 hours, cracking in the transparent substrate for optical elements, light-leak from the liquid crystal panel and color mismatching/coloration/color ununiformity were not observed.

The present application incorporates herein by reference Patent Application No. 2012-079906 filed on Mar. 30, 2012 in its entirety.

INDUSTRIAL APPLICABILITY

The present invention is applicable to all of industrial fields requiring a surface light source, and more particularly to a surface light source for various illumination devices, as well as a surface light source for various display devices, and display devices of personal computers or terminals such as cellular phones and multifunctional cellular phones.

The invention claimed is:

1. A transparent substrate for optical elements, comprising:
   a transparent resin film;
   an inorganic layer laminated on and directly contacting the transparent resin film;
   a hydrophilic layer laminated on and directly contacting the inorganic layer; and
   a hydrophobic layer laminated on and directly contacting the hydrophilic layer, wherein the hydrophobic layer has a higher hydrophobicity than the hydrophilic layer,
   wherein the inorganic layer comprises a lower layer, an intermediate layer and an upper layer from a side of the resin film, and a refractive index is increased in the order of the upper layer, the lower layer and the intermediate layer, and
   wherein the hydrophilic layer essentially consists of any one or two or more species selected from an acrylic resin, a polyamide resin and a polyester resin.

2. The transparent substrate for optical elements of claim 1, wherein the hydrophobic layer comprises any one or two or more species selected from an olefin resin, an alicyclic olefin resin, an acrylic resin, and a polyester resin.

3. The transparent substrate for optical elements of claim 1, wherein the inorganic layer has a thickness of 5-500 nm, the hydrophilic layer has a thickness of 90-1000 nm, and the hydrophobic layer has a thickness of 10-1000 nm.

4. The transparent substrate for optical elements of claim 1, wherein the inorganic layer is formed from one or more species selected from the group consisting of silicon oxides, silicon nitrides and silicon nitride oxides.

5. The transparent substrate for optical elements of claim 1, wherein the transparent resin film is formed from a polymer selected from the group consisting of polyethylenenaphthalate, polyethyleneterephthalate, polyethersulfone, acrylic resin and triacetyl cellulose.

6. The transparent substrate for optical elements of claim 1, wherein the inorganic layer has a thickness of 10-400 nm.

7. The transparent substrate for optical elements of claim 1, wherein the transparent substrate has a water vapor permeability of $10^{-5}$ to $10^{-6}$ g/m$^2$/day.

8. The transparent substrate for optical elements of claim 1, wherein the inorganic layer has a thickness of 5-500 nm.

9. The transparent substrate for optical elements of claim 1, wherein the hydrophobic layer has a thickness of 10-1000 nm.

10. The transparent substrate for optical elements of claim 1, wherein the hydrophilic layer has a thickness of 90-1000 nm.

11. The transparent substrate for optical elements of claim 1, wherein a total thickness of the hydrophobic layer and the hydrophilic layer is 100-2000 nm.

12. The transparent substrate for optical elements of claim 1, wherein the hydrophobic layer comprises any one or two species selected from an olefin resin and a polyester resin.

13. A polarizer plate for a liquid crystal display device, comprising the transparent substrate for optical elements according to claim 1.

14. A liquid crystal display device, comprising the polarizer plate for a liquid crystal display device according to claim 13.

15. An organic electroluminescence element, comprising the transparent substrate for optical elements according to claim 1.

16. An organic electroluminescence illumination device, comprising the organic electroluminescence element according to claim 15.

* * * * *